United States Patent
Damgaard et al.

[19]

[11] Patent Number: 6,150,890
[45] Date of Patent: *Nov. 21, 2000

[54] DUAL BAND TRANSMITTER FOR A CELLULAR PHONE COMPRISING A PLL

[75] Inventors: Morten Damgaard, Laguna Hills; Leo L. Li, Trabuco Canyon, both of Calif.

[73] Assignee: Conexant Systems, Inc., Newport Beach, Calif.

[*] Notice: This patent is subject to a terminal disclaimer.

[21] Appl. No.: 09/163,798

[22] Filed: Sep. 30, 1998

Related U.S. Application Data

[63] Continuation-in-part of application No. 09/044,281, Mar. 19, 1998, Pat. No. 6,005,443.

[51] Int. Cl.[7] ............................. H03L 7/093; H03L 7/18; H03L 7/185
[52] U.S. Cl. ............................. 331/14; 331/16; 331/17; 331/25; 331/60; 331/76
[58] Field of Search ................................. 331/14, 16, 17, 331/25, 60, 74, 76, 77

[56] References Cited

U.S. PATENT DOCUMENTS

| 3,854,102 | 12/1974 | Seipel et al. | 331/25 |
| 3,882,424 | 5/1975 | Debois et al. | 331/25 |
| 5,903,196 | 5/1999 | Salvi et al. | 331/76 |
| 5,983,081 | 11/1999 | Lehtinen | 455/76 |
| 6,005,443 | 12/1999 | Damgaard et al. | 331/14 |

FOREIGN PATENT DOCUMENTS

| 0 798 880 | 10/1997 | European Pat. Off. . |
| 0 944 172 | 9/1999 | European Pat. Off. . |
| WO 98/25353 | 6/1998 | WIPO . |

OTHER PUBLICATIONS

Simon Haykin, *Communication Systems*, Second Edition, McMaster University, John Wiley & Sons, Inc., 1983, pp. 80–85.

GSM Technical Specification, GSM 05.05, Jul. 1996, Version 5.2.0., Euorpean Telecommunication Standards Institute, pp. 8, 11, 14, 33.

Lawrence J. Curran. "RFICs: Dual–Band Cell Phones Emerge," EDN, May 22, 1997, pp. 21,22,24.

Bill Menezes, "Study: Dual Mode Will Explode," *Wireless Week*, Jun. 30, 1997.

"Track to Multi–band GSM" *Symbionics*, Global System for Mobile Communication Data Sheet.

Rockwell, RF–122 Power Amplifier Controller for Heterojunction Bipolar Transistor Power Amplifers, Preliminary Data Sheet, Oct. 13, 1997, pp. 1–5.

Rockwell, RF–123 Translation Loop Preliminary Data Sheet, Sep. 12, 1996, pp. 1–6.

Rockwell, RF–130 Power Amplifier for GSM Applications, Preliminary Data Sheet, Dec. 3, 1997, pp. 1–5.

(List continued on next page.)

*Primary Examiner*—Siegfried H. Grimm
*Attorney, Agent, or Firm*—Knobbe, Martens, Olson & Bear, LLP

[57] ABSTRACT

Disclosed is a dual band wireless phone, such as a cellular phone for a mobile communications system, with a dual band transmitter that includes a phase-locked loop (PLL). The dual band transmitter includes first and second power amplifiers and the PLL. The first power amplifier has a first input for a first signal at a first radio frequency band, and a first output for an amplified first signal. The second power amplifier has a second input for a second signal at a second radio frequency band and a second output for an amplified second signal. The outputs of the power amplifiers are connectable to an antenna. The PLL generates two output frequency ranges and includes a voltage-controlled oscillator (VCO) which has a first output connected to the first power amplifier and generates a first signal. A frequency multiplier has an input connected to the first output of the VCO and a second output connected to the second power amplifier. The frequency multiplier receives the first signal and generates the second signal.

50 Claims, 9 Drawing Sheets

OTHER PUBLICATIONS

Rockwell, RF–133 RF/IF, Transceiver for GSM Application, Preliminary Data Sheet, Oct. 31, 1997, pp. 1–16.

Rockwell, RF–230 GSM 1800/PCS 1900 Power Amplifier, Preliminary Data Sheet, Jan. 14, 1998, pp. 1–5.

Floyd M. Gardner, *Phaselock Techniques*, Second Edition, John Wiley & Sons, 1979, ISBN 0–471–04294–3, pp. 1–17, 106,107,204–209.

Philips Semiconductor Discrete Semicondutors Data Sheet, BFG505: BFG505; BFG505/X NPN 9 GHz Wideband Transistors, Oct. 2, 1998.

DUAL BAND TRANSMITTER FOR A CELLULAR PHONE COMPRISING A PLL

This application is a continuation in part application of U.S. patent application Ser. No. 09/044,281 filed on Mar. 19, 1998, and now Pat. No. 6,005,443 and entitled Phase Locked Frequency Synthesizer For Multi-Band Application.

BACKGROUND OF THE INVENTION

The invention relates to transmitters used in a communications system. More particularly, the invention relates to a phase-locked loop (PLL) of a dual band transmitter used in a wireless phone, such as a dual band cellular phone for mobile communications systems.

Cellular phones are designed to operate within the environment of one of several mobile communications networks. An exemplary environment is a mobile communications network according to a standard known as GSM (Global System for Mobile communications) created by the European Telecommunications Standards Institute (ETSI). In GSM, there is an assigned frequency band around 900 MHz for Standard GSM, and an assigned frequency band around 1800 MHz for DCS1800 (Digital Communications System, DCS). Other environments include systems known as Advanced Mobile Phone System (AMPS) operating in a frequency band around 800 MHz, and as Personal Communications System (PCS) operating in a frequency band around 1900 MHz.

As the number of users of cellular phones increases, some operators have added capacity to their networks by including more than only one frequency band in their networks. In the case of the GSM system, for example, the frequency bands around 900 MHz and 1800 MHz are now used to expand the capacities of certain networks.

Manufacturer of cellular phones, therefore, are developing a new generation of cellular phones which are operable at, for example, two frequency bands. A cellular phone operable at two frequency bands is referred to as a dual band cellular phone. As the dual band cellular phone has to transmit signals at both frequency bands, duplication of functions is required. For example, a second PLL is required in a GSM900/DCS1800 dual band cellular telephone having transmit frequency bands between 890 MHz and 915 MHz for the GSM band, and between 1710 MHz and 1785 MHz for the DCS 1800 band. This would require using two separate voltage-controlled oscillators (VCO), which adds complexity and expense to the over-all system design. Duplication of functions such as VCOs, however, leads to higher manufacturing costs and ultimately to higher prices for the dual band cellular phones.

SUMMARY OF THE INVENTION

There is therefore a need to keep the manufacturing costs caused by duplication of functions as low as possible.

An aspect of the invention involves a cellular phone for a mobile communications system. The phone is operable in a first radio frequency band and a second radio frequency band and comprises a dual band transmitter and an antenna. The dual band transmitter comprises a phase-locked loop (PLL) which can generate two or more output frequency ranges. The PLL comprises a first frequency divider configured to divide a frequency signal by a value N, a phase detector responsive to an output of the first divider, and a loop filter responsive to an output of the phase detector. A voltage-controlled oscillator (VCO) is responsive to an output of the loop filter and a frequency multiplier is responsive to an output of the VCO. A band-switch has a first input responsive to the output of the VCO, a second input responsive to an output of the frequency multiplier, and a third input responsive to a control signal to select for output from said band-switch one of the first and second inputs. A mixer has two inputs, one mixer input is responsive to the output of the band-switch and a second mixer input is responsive to a radio frequency signal. A second frequency divider is configured to divide an input frequency by a value M. The second divider is responsive to an output of the mixer, and an output of the second frequency divider provides an input to the phase detector.

Another aspect of the invention involves a method for generating at least two output frequency ranges from a phase locked loop (PLL) in a cellular phone for a mobile communications system. The PLL includes a phase detector, a loop filter, and a single voltage-controlled oscillator (VCO). An output of the VCO is multiplied by a predetermined value to produce a multiplied output, and a desired output frequency is selected. Either the output of the VCO or the multiplied output are selectively fed back to the phase detector, based upon the selected desired output frequency. When the output of the VCO is selected, the output of the VCO is fed back, and when the multiplied output is selected, the multiplied output is fed back.

A further aspect of the invention involves a dual band transmitter for a wireless phone. The dual band transmitter comprises a first power amplifier, a second power amplifier and a phase locked loop (PLL). The first power amplifier has a first input for a first signal in a first radio frequency band, and a first output for an amplified first signal. The first output is connectable to an antenna. The second power amplifier has a second input for a second signal in a second radio frequency band and a second output for an amplified second signal. The second output is connectable to the antenna. The PLL can generate two or more output frequency ranges and comprises a first frequency divider configured to divide a frequency signal by a value N. A phase detector is responsive to an output of the first divider and a loop filter is responsive to an output of the phase detector. A voltage-controlled oscillator (VCO) is responsive to an output of the loop filter and a frequency multiplier is responsive to an output of the VCO. A band-switch has a first input responsive to the output of the VCO, a second input responsive to an output of the frequency multiplier, and a third input responsive to a control signal to select for output from the band-switch one of the first and second inputs. A mixer has two inputs, one mixer input is responsive to the output of the band-switch and a second mixer input is responsive to a radio frequency signal. A second frequency divider is configured to divide an input frequency by a value M. The second divider is responsive to an output of the mixer, and an output of the second frequency divider provides an input to the phase detector.

A further aspect of the invention involves a dual band transmitter for a wireless phone. The dual band transmitter comprises a first power amplifier, a second power amplifier and a phase locked loop (PLL). The first power amplifier has a first input for a first signal in a first radio frequency band, and a first output for an amplified first signal. The first output is connectable to an antenna. The second power amplifier has a second input for a second signal in a second radio frequency band and a second output for an amplified second signal. The second output is connectable to the antenna. The PLL can generate two or more output frequency ranges. The PLL comprises a first frequency divider configured to divide a frequency signal by a value N, a phase detector responsive to an output of the first frequency divider and a loop filter responsive to an output of the phase detector. A voltage-controlled oscillator (VCO) is responsive to an output of the loop filter, and at least one frequency multiplier is responsive to an output of the VCO. A mixer has two inputs, one mixer input is responsive to the output of the VCO and a second mixer input is responsive to a local oscillator signal. The second frequency divider is configured to divide an input frequency by a value M and connected to an output of the mixer. An output of the second divider provides an input to the phase detector, and a selector is connected to the output of the at least one frequency multiplier. The selector is configured to select an output frequency.

Another aspect of the invention involves a cellular phone for a mobile communications system. The phone is operable in a first radio frequency band and a second radio frequency band, and comprises a dual band transmitter and an antenna. The dual band transmitter comprises a phase-locked loop (PLL) which can generate two or more output frequency ranges. The PLL comprises a first frequency divider configured to divide a frequency signal by a value N, and a phase detector responsive to an output of the first frequency divider. A loop filter is responsive to an output of the phase detector and a voltage-controlled oscillator (VCO) is responsive to an output of the loop filter. At least one frequency multiplier is responsive to an output of the VCO. A mixer has two inputs, one mixer input is responsive to the output of the VCO and a second mixer input is responsive to a local oscillator signal. A second frequency divider is configured to divide an input frequency by a value M and is connected to an output of the mixer. A output of the second divider provides an input to the phase detector. A selector is connected to the output of the at least one frequency multiplier and is configured to select an output frequency.

A further aspect of the invention involves a method for generating at least two output frequency ranges from a phase locked loop (PLL) in a cellular phone for a mobile communications system. The PLL comprises a single voltage controlled oscillator (VCO), an adjustable first frequency divider which divides by a value N, a second frequency divider which divides by a value M, a phase detector, and a loop filter. The method comprises multiplying an output of the VCO by a predetermined value to produce a multiplied output frequency, selecting a desired output frequency of one of the VCO output and the multiplied output frequency, and adjusting the values of the first frequency divider such that a ratio N/M equals the value of the predetermined value when the multiplied output is selected, and adjusting the ratio N/M equal to the value "1"when the VCO output is selected.

Another aspect of the invention involves a dual band transmitter for a wireless phone. The dual band transmitter comprises a first power amplifier, a second power amplifier, and a phase locked loop (PLL). The first power amplifier has a first input for a first signal in a first radio frequency band, and a first output for an amplified first signal. The first output is connectable to an antenna. The second power amplifier has a second input for a second signal in a second radio frequency band and a second output for an amplified second signal. The second output is connectable to the antenna. The PLL can generate two or more output frequency ranges. The PLL comprises a voltage-controlled oscillator (VCO) having a first output connected to said first power amplifier. The VCO generates the first signal. A frequency multiplier has an input connected to the first output of the VCO and a second output connected to the second power amplifier. The frequency multiplier receives the first signal and generates the second signal.

A further aspect of the involves a method for generating two output frequency ranges from a phase locked loop (PLL) in a dual band transmitter for a wireless phone. The PLL comprises a single voltage controlled oscillator (VCO). The method comprises multiplying an output of the VCO by a predetermined value to produce a multiplied output frequency, and selecting a desired output frequency of one of the VCO output and the multiplied output frequency.

Another aspect of the invention involves a cellular phone for a mobile communications system. The phone is operable in a first radio frequency band and a second radio frequency band, and comprises a dual band transmitter and an antenna. The dual band transmitter includes a phase-locked loop (PLL) which can generate two or more output frequency ranges. The PLL comprises a voltage-controlled oscillator (VCO) which has a first output connected to the first power amplifier and which generates the first signal. A frequency multiplier has an input connected to said first output of the VCO and a second output connected to said second power amplifier. The frequency multiplier receives the first signal and generates the second signal.

Brief Description of the Drawings

These and other aspects, advantages, and novel features of the invention will become apparent upon reading the following detailed description and upon reference to the accompanying drawings.

DETAILED DESCRIPTION OF THE PREFERRED EMBODIMENT

A preferred embodiment of the invention is described with reference to a cellular phone for use in a mobile communications system. It is contemplated that the invention is equally applicable in other wireless devices such as conventional cordless phones for home or office use.

A mobile communications system, for example according to the GSM standard, is structured to have a variety of individual regions called cells, and to comprise a variety of fixed transceiver stations called base transceiver stations, and a plurality of mobile stations, the cellular phones. Usually, one base transceiver station defines one cell and handles telephone traffic to and from cellular phones which are currently located in the cell.

Figure 1:
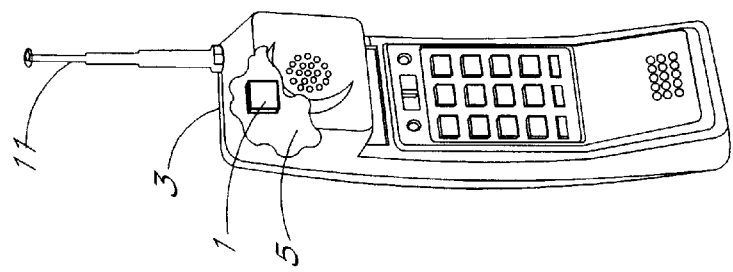
FIG. 1 is a schematic illustration of a cellular phone cut away to show a portion of the motherboard.

FIG. 1 schematically illustrates a dual band cellular phone 3 made in accordance with the invention. A portion of the case of the dual band cellular phone 3 is cut away to show a motherboard 5 of the cellular phone 3 with a dual band transmitter 1 positioned thereon. Although not shown in FIG. 1, those skilled in the art will appreciate that the cellular phone 3 comprises a plurality of other components and functional modules, such as the components of a receive path and a transmit path. The cellular phone 3 further includes an antenna 11, a display and a keypad.

The receive path of such a dual band cellular phone 3 includes a radio frequency (RF) receiver, an analog-to-digital converter, a demultiplexer and a demodulator. The transmit path comprises a multiplexer, modulator, digital-to-analog converter and an RF transmitter. Further functional modules include, for example, a channel coder/decoder and a speech coder/decoder. Both the RF receiver and the RF transmitter are usually connected to the antenna 11 by means of a diode switch (eventually in combination with a band selector) which connects the antenna 11 either to the RF receiver or to the RF transmitter.

The RF transmitter comprises an amplifier stage for amplifying the RF signals according to electrical characteristics, for example, a defined power level versus time profile and a defined spectral mask, before the RF signals are fed to the antenna 2 and emitted as radio signals. The spectral mask and the power level versus time profile are defined in GSM Technical Specification GSM 05.05, July 1996, Version 5.2.0, entitled "Digital cellular telecommunications system (Phase 2+); Radio transmission and reception", Paragraph 4.2.2, and Annex B.

Figure 2:
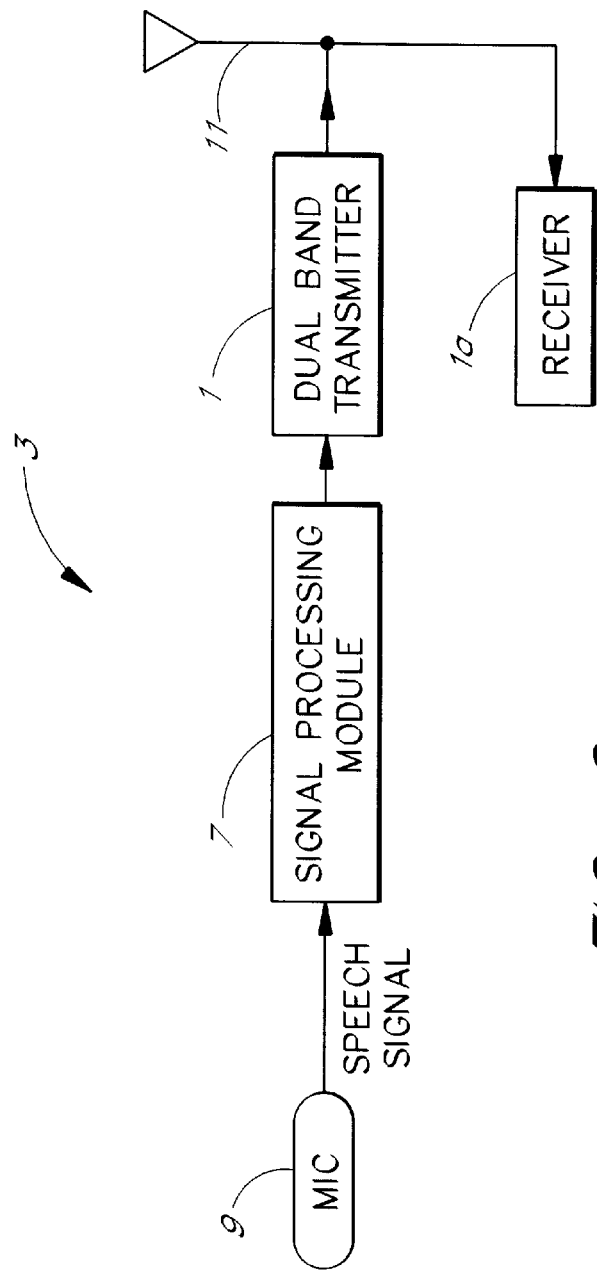
FIG. 2 is a simplified illustration of a transmit path of the cellular phone shown in FIG. 1.

FIG. 2 illustrates a simplified embodiment of the transmit path of the dual band cellular phone 3. The receive path is indicated by means of a receiver 1a which includes, for example, the radio frequency (RF) receiver. Within the cellular phone 3, the transmitter 1, which includes two power amplifiers, and a processing module 7 are positioned on the motherboard and interconnected between the antenna 2 and a microphone 9 of the cellular phone 3. In this simplified illustration, the processing module 7 performs most speech and signal processing in a transmit direction, for example, voice encoding and channel encoding. The dual band transmitter 1 transforms the encoded signals into the RF domain. It is contemplated that the illustrated separation into a signal processing module 7 and a dual band transmitter 1 is for illustrative purposes only. Those skilled in the art will appreciate that other separations are possible. For instance, one definition may be that a dual band transmitter only includes power amplifiers and any modulation is performed, for example, in the signal processing module 7. In the following description, the dual band transmitter 1 performs all RF processing.

The dual band transmitter modulates an RF carrier of, for example, nominal either 900 MHz or 1800 MHz with the processed speech signal. The RF signals emitted from the dual band transmitter 1 have frequencies within a transmit band of 890 MHz to 915 MHz for GSM900, and 1710 MHz to 1785 MHz for DCS1800. The dual band transmitter 1 includes a phase-locked loop (PLL) which determines the transmit bands and provides for frequency stability and accuracy.

Figure 3:
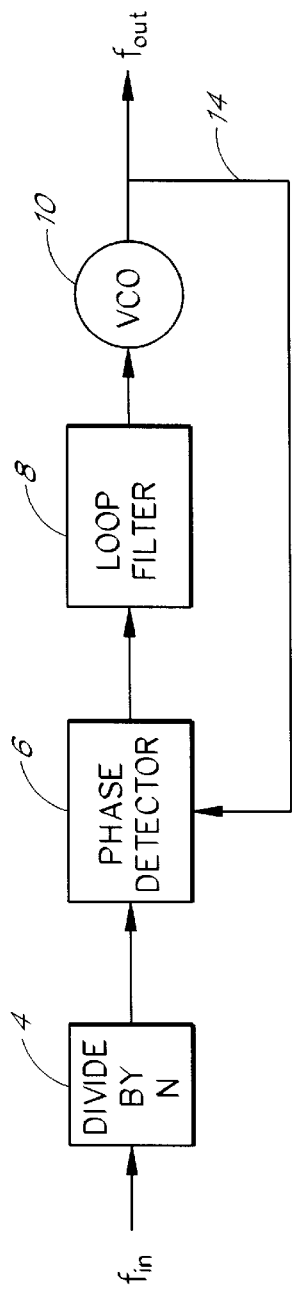
FIG. 3 is a block diagram showing a basic Phase-Locked Loop (PLL).

FIG. 3 illustrates a standard Phase-Locked Loop (PLL). The basic PLL has an input signal having an input frequency $f_{in}$ which is divided by a divider 4, wherein the divider 4 divides the input frequency $f_{in}$ by a value N. The output of the divider 4 is then input into a phase detector 6. The phase detector 6 outputs a voltage that is proportional to a phase difference between two input signals (frequencies). This phase detector output voltage is then input into a loop filter 8. The loop filter 8 smoothes the phase detector output voltage and determines the loop performance based upon selected loop filter values. The output of the loop filter 8 adjusts a voltage-controlled oscillator (VCO) 10 and determines the output frequency of the VCO 10. The output of the VCO 10 is then fed back as an input to the phase detector 6 via a feedback loop 14. The output voltage of the phase detector 6 will vary according to any change in the phase difference between the output frequency of the VCO 10 and the input frequency $f_{in}$.

The feedback loop 14 thus provides a means of "locking" the phase of an output frequency $f_{out}$ in accordance with the phase of the input frequency $f_{in}$. If the input frequency $f_{in}$ is a highly stable reference frequency, the PLL produces a highly stable output frequency $f_{out}$. The PLL produces an output frequency $f_{out}$, equal to the value $[f_{in}/N]$, wherein the phase of the VCO output frequency $f_{out}$, follows the phase of the input frequency $f_{in}$.

Figure 4:
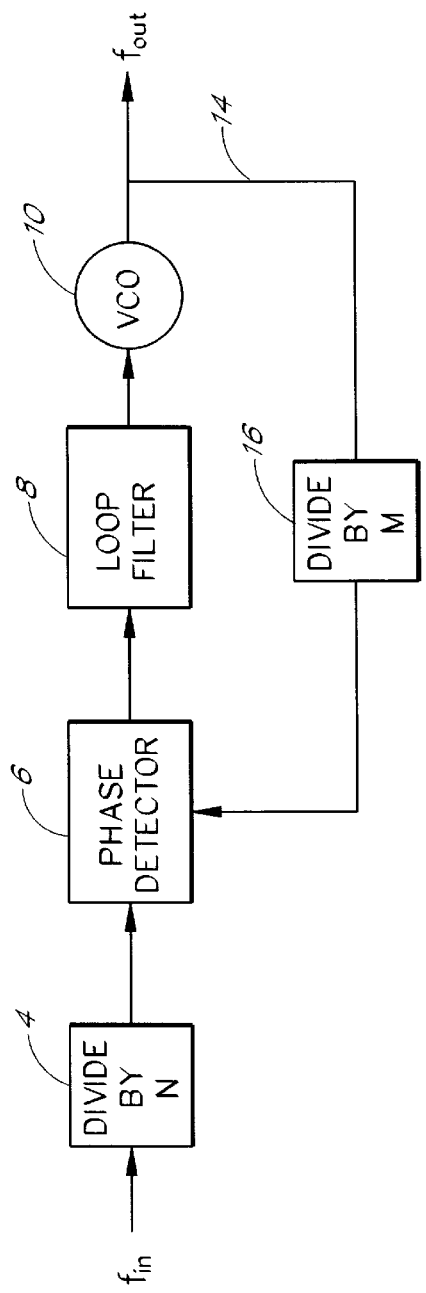
FIG. 4 is a block diagram of a PLL frequency synthesizer utilizing a program counter in the feedback loop.

As illustrated in FIG. 4, a divider 16 may be used in the feedback loop 14 in order to change the output frequency $f_{out}$. In this case, the output frequency $f_{out}$ from the VCO 10 is equal to the value $[(f_{in} M)/N]$. If the divider 16 is implemented using a programmable counter, the value of M can be changed. Thus, the output frequency $f_{out}$ can be adjusted to a desired value by varying the value of "M".

Figure 5:
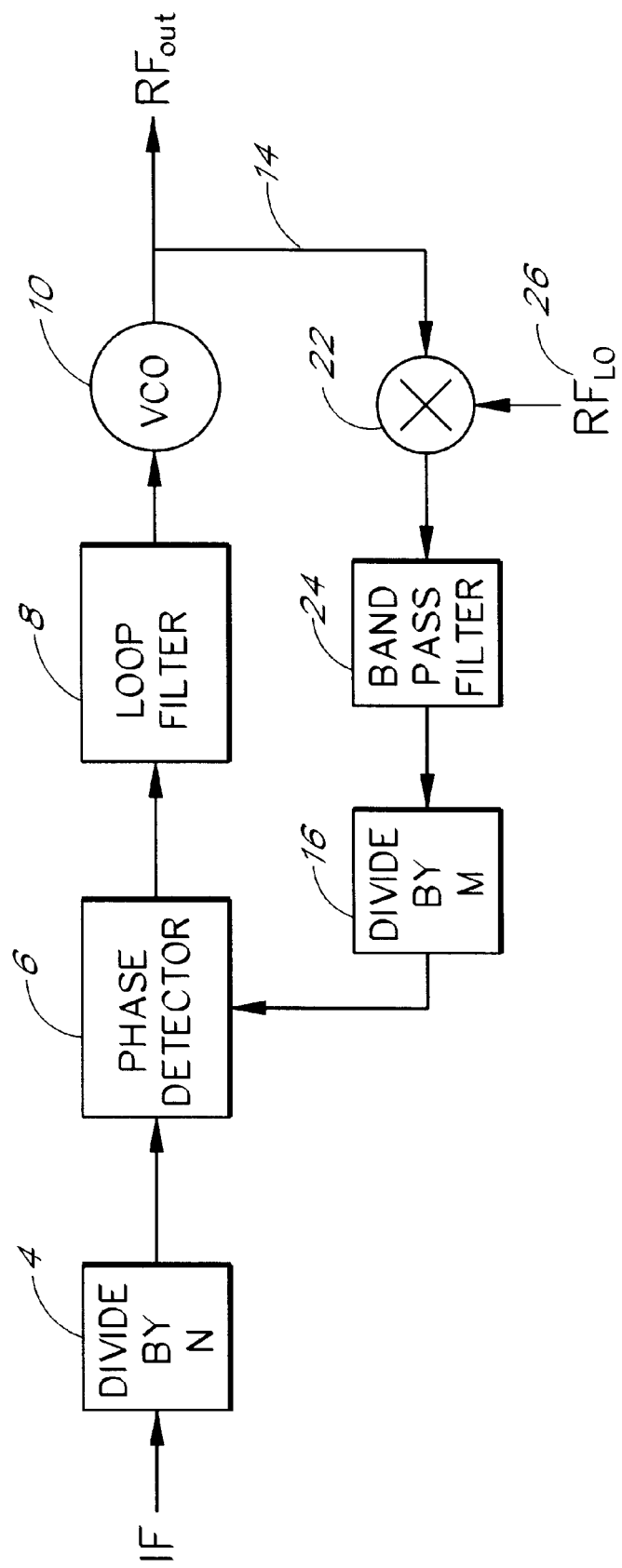
FIG. 5 is a block diagram of a PLL wherein the feedback loop contains a mixer.

FIG. 5 illustrates an application of a PLL. A phase modulated intermediate input frequency IF is input to the first divider 4 of the PLL. The feedback loop 14 contains two additional blocks, however. A mixer 22 mixes a local oscillator signal $RF_{LO}$ (frequency $RF_{LO}$) with a signal $RF_{OUT}$ (frequency $RF_{OUT}$) and the output of the mixer 22 is input into a bandpass (BP) filter 24. The output of the mixer 22 may be referred to as the "feedback frequency". The feedback frequency can be selected from one of the numerous frequencies produced by a harmonic mixing within the mixer 22. In general, the output of the mixer 22 is equal to $[\pm n*RF_{OUT} \pm m*RF_{LO}]$. If n and m are "1", then the selected outputs of the mixer 22 are either $RF_{OUT}-RF_{LO}$ or $RF_{LO}-RF_{OUT}$ (assuming frequency down-conversion).

The bandpass filter 24 removes any unwanted mixing products produced by the mixer 22 and determines which frequency is fed-back through the M divider 16. It is contemplated that instead of the bandpass filter 24 a low-pass filter can be used. The purpose of a filter is to prevent any unwanted mixing products and the local oscillator signal $RF_{LO}$ from reaching the divider 16 and/or the phase detector 6. At the same time, the filter must pass the desired feedback frequency. In embodiments in which the wanted feedback frequency is lower than the local oscillator signal $RF_{LO}$ and other mixing products, a low-pass filter is sufficient to pass only the desired feedback frequency.

The remaining blocks operate as described in the previous figures. The PLL translates (i.e., moves) the frequency of the input signal IF to the VCO frequency with the same phase. Thus, by adjusting the value of the local oscillator frequency $RF_{LO}$, a desired output frequency $RF_{OUT}$ can be produced for a given intermediate frequency IF.

In the following general equations, $f_{fb}$ is the feedback frequency output by the mixer 22, $f_{VCO}$ is the VCO frequency, and $f_{in}$ is the input frequency. The variables "n" and "m" are integer multipliers generated by the harmonic mixing. These equations illustrate the operation of the circuit shown in FIG. 5.

$$f_{fb} = \pm n \cdot f_{VCO} \pm m \cdot f_{LO} = \frac{1}{n} f_{fb} \pm \frac{m}{n} f_{LO}$$

$$f_{fb}/M = f_{in}/N$$

$$f_{fb} = f_{in} \cdot \frac{M}{N}$$

$$f_{OUT} = f_{VCO} = \pm f_{in} \cdot \frac{M}{N} \cdot \frac{1}{n} \pm \frac{m}{n} f_{LO}$$

Assuming "n" and "m" are 1, the equation becomes $$f_{OUT} = f_{VCO} = \pm f_\epsilon \cdot \frac{M}{N} \cdot \pm \cdot f_{LO}$$

For applications that require two different frequency bands $RF_{OUT}$, such as a dual-band cellular telephone, a second PLL would normally be required to provide for the two transmit bands (890–915 MHz and 1710–1785 MHz). This would require using two separate VCOs, which adds complexity and expense to the over-all system design.

Figure 6:
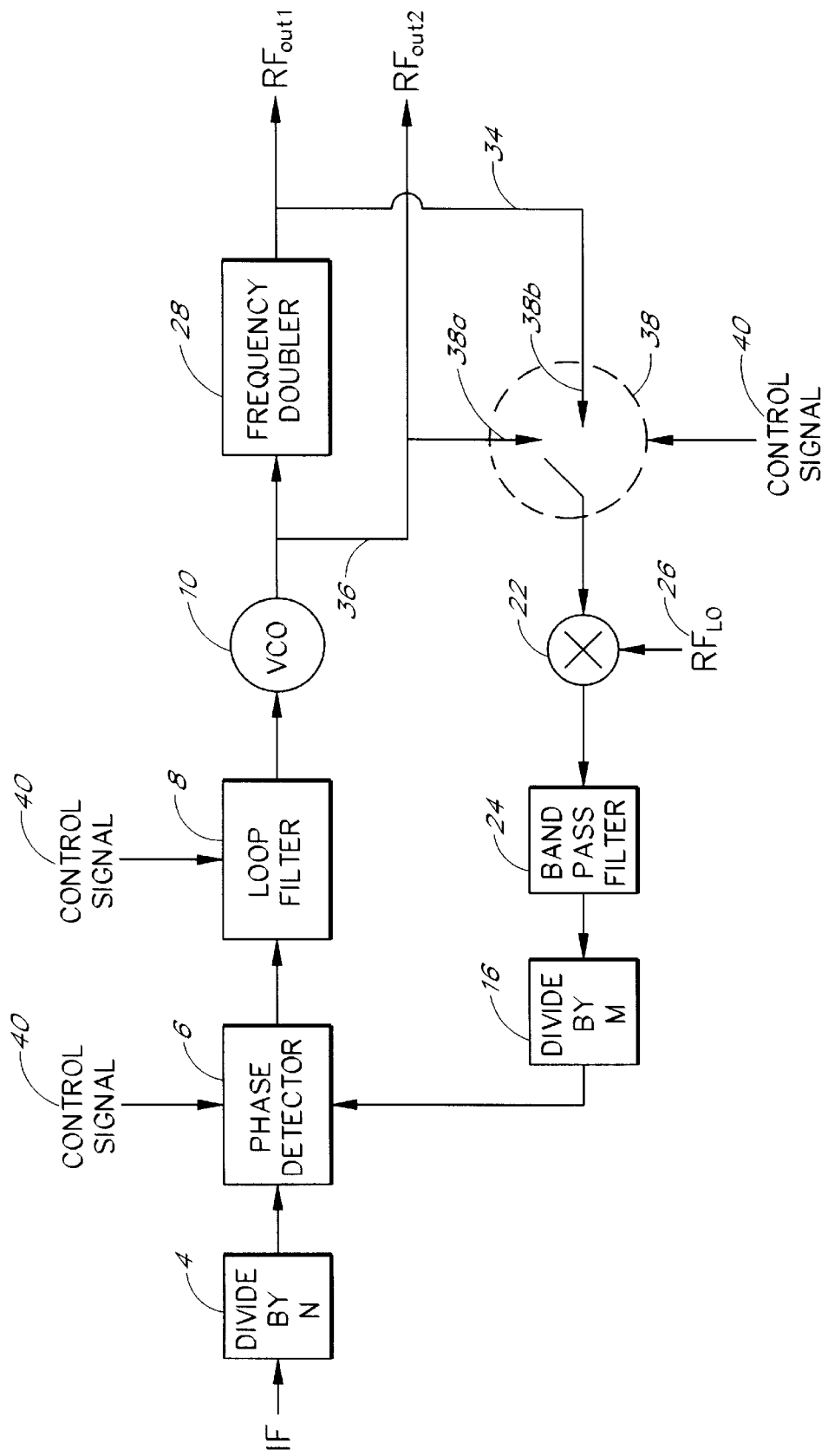
FIG. 6 is a block diagram of a PLL according to a first embodiment of the present invention, wherein a frequency doubler and a band-switch are used to provide two different output frequency ranges.

An embodiment of a PLL in accordance with the present invention is shown in FIG. 6. The PLL block operates generally as described in FIG. 5. However, the illustrated PLL includes two additional components, a frequency doubler 28 and a band-switch 38. When the band-switch 38 is connected directly to the output of the VCO 10 (i.e. the band-switch 38 is in a position "38a"), the circuit operates as described above with reference to FIG. 5. That is, $$f_{OUT} = H \cdot f_{VCO}$$

$$f_{OUT} = \pm f_\epsilon \cdot \frac{M}{N} \cdot \frac{1}{n} \pm \frac{m}{n} \cdot f_{LO}$$

When the band-switch 38 is in a position "38b", the operation of the PLL is different. Instead of the output of the VCO 10 being fed back to the mixer 22, the output of the frequency doubler 28 is fed back to the mixer 22. The frequency doubler 28 doubles the input frequency supplied by the VCO 10 and outputs a signal $RF_{out1}$ (frequency $RF_{out1}$). While the operation of the presently preferred embodiment is illustrated and described using a frequency doubler, the principles of the present invention may be implemented with any frequency multiplier (or divider) without departing from the teachings herein. For example, the frequency doubler 28 could actually divide the VCO output frequency by 2, or could triple the frequency supplied by the VCO 10. It should be noted that the term "multiplier" as used herein encompasses a divider, since multiplying by ½ is equivalent to dividing by 2.

This circuit is defined by the following equations, wherein H is the multiplier value.

$$f_{OUT} = H \cdot f_{VCO}$$

$$f_{OUT} = \pm f_\epsilon \frac{M}{N} \cdot \frac{1}{n} \pm \frac{m}{n} \cdot f_{LO}$$

To preserve modulation index:

$$\frac{M}{N \cdot n} = 1 \quad \text{(Independent of } H\text{)}$$

Notice that the modulation index is independent of the multiplier value H. Thus, by setting the values of the input frequency IF, the VCO 10, and the mixer input frequency $RF_{LO}$ as desired, two distinct frequency ranges may be output by the PLL, using only a single VCO 10. Another advantage to using this approach is that there is no need to adjust the N/M ratio, so that the dividers 4, 16 do not need to be programmable.

If the frequency doubler 28 is used, however, the loop gain of the PLL doubles, assuming that the M divider 16 value is kept constant. If the value of M was changed to compensate for the loop gain, the phase relationship between the input and output frequencies would also change. Thus, there is a need to compensate for the loop gain of the circuit when the band-switch 38 is connected to the frequency doubler output. This problem may be solved by either having a loop filter 8 with a selectable gain, a phase detector 6 with a selectable gain, or by having both a loop filter 8 and a phase detector 6 with a selectable gain. A control signal line 40 is input to the band-switch 38, the phase detector 6 and/or the loop filter 8. When the control signal on the control signal line 40 places the band-switch 38 into position "38a," the gain of the phase detector 6 and/or the loop filter 8 are set to the required values for taking the output directly from the VCO 10. When the band-switch 38 is set to position "38b" by the control signal on the control signal line 40, the gain of the phase detector 6 and/or the loop filter 8 is set to the required value for taking the output from the frequency doubler 28. Thus, a single control line can be used to adjust the PLL to generate two distinct output frequency ranges using only a single VCO.

Using the GSM900/DCS1800 dual-band cellular telephone as an example, the VCO can be designed to output the frequency range 855–915 MHz. Taking the output frequency directly from the VCO provides the necessary frequency range for the GSM900 transmit band (890–915 MHz). Switching the band-switch 38 to position "38b" doubles the output frequency, and provides the frequencies of 1710–1785 MHz required for the DCS1800 transmit band.

Figure 7:
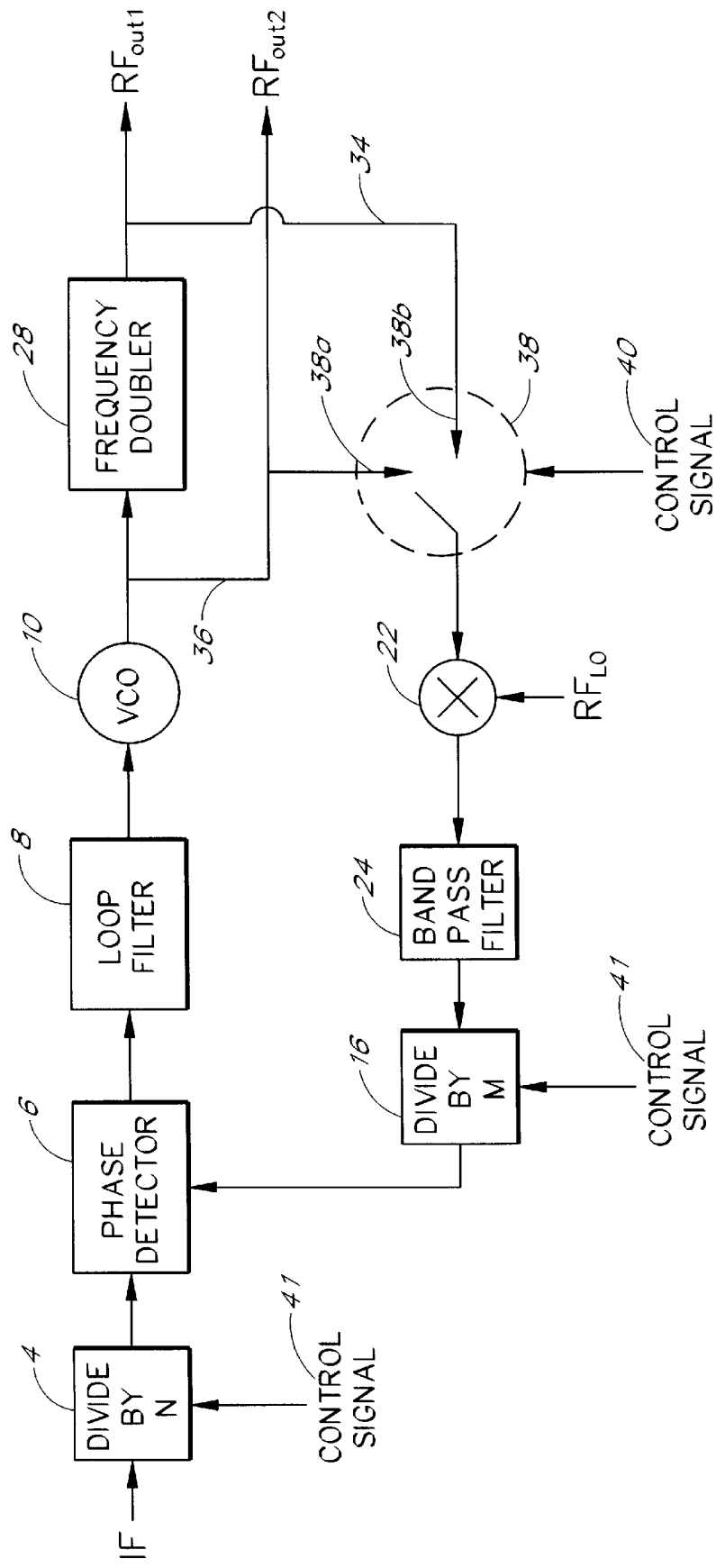
FIG. 7 is a block diagram of a PLL according to a second embodiment of the present invention.

FIG. 7 illustrates a second embodiment of the present invention. In the first embodiment it is assumed that the M value is kept constant. However, the value of M may be adjusted in order to compensate for the loop gain. If M is adjusted, though, the value of N is also adjusted in order to output the desired frequency. In FIG. 7, a control signal on the control signal line 41 adjusts the values of N and M, as required. Additionally, the gain of the phase detector and/or loop filter may also be adjusted if necessary (not shown).

A conventional method for generating a constant envelope modulated signal is shown in FIG. 5. A Phase Locked Loop (PLL) has a modulated signal IF input as the reference input to the phase detector 6. By modifying this architecture, as shown in FIG. 6, a modulated signal can be generated which is equal to H * $f_c$, wherein $f_c$ is the output frequency of the VCO. For this method to work correctly, the N/M ratio is equal to the multiplication factor "H" applied to the VCO output frequency. This design requirement keeps the modulation index (and the modulation bandwidth) equal at the input and output of the loop. Consider the following equations $$f_{fb} = \pm n \cdot f_{VCO} \pm m \cdot f_{LO} = \frac{1}{n} f_{fb} \pm \frac{m}{n} f_{LO}$$

$$f_{fb}/M = f_{in}/N$$

$$f_{fb} = f_{in} \cdot \frac{M}{N}$$

$$f_{OUT} = f_{VCO} = \pm f_{in} \cdot \frac{M}{N} \cdot \frac{1}{n} \pm \frac{m}{n} \cdot f_{LO}$$

$$f_{oit} = H \cdot f_{VCO} = \pm \frac{M \cdot H}{N \cdot n} f_{in} \pm \frac{mH}{n} \cdot f_{LO}$$

To preserve modulation index:

$$\frac{M \cdot H}{N \cdot n} = 1$$

Assuming "n" is equal to 1, the divider ratio N/M equals H in order to preserve the modulation index.

Figure 8:
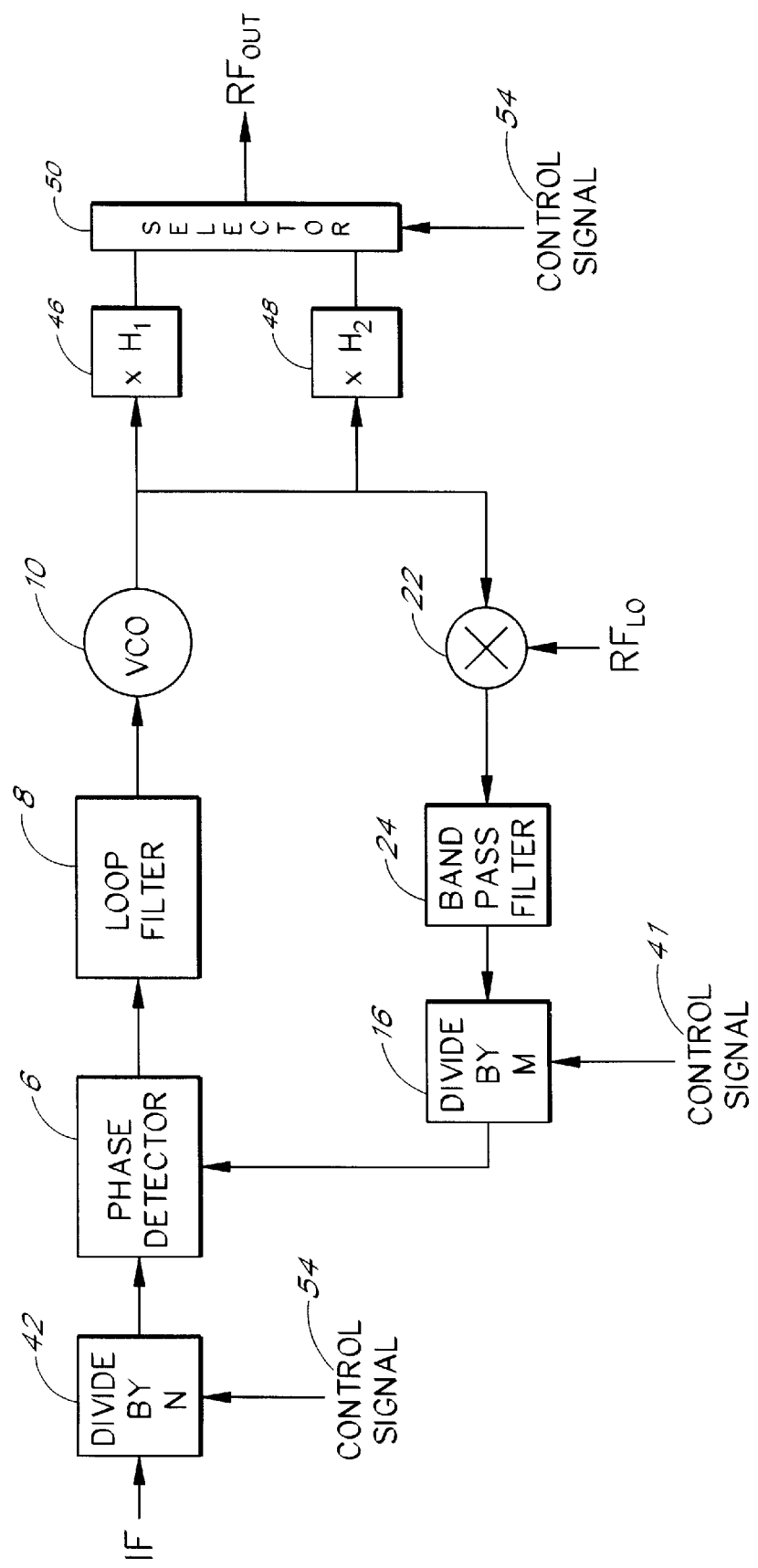
FIG. 8 is a block diagram of a PLL according to a third embodiment of the present invention, wherein multiplier blocks and a selector are incorporated outside of the feedback loop.

In FIG. 8, a third embodiment of a PLL is shown. The output of the VCO 10 is fed back to the mixer 22, and the loop operates generally as described with reference to FIG. 5. The output of the VCO 10 is also input to two multiplier blocks 46, 48. The multiplier blocks 46, 48 multiply the output of the VCO 10 by the values "$H_1$" and "$H_2$". For example, if the VCO 10 is adjustable over the frequency range 855–915 MHz, $H_1$ can be set equal to "1" and $H_2$ equal to "2". If the output is taken from the $H_1$ block 46, the GSM900 band (890–915 MHz) can be provided. If the output is taken from the $H_2$ block 48, the DCS1800 band (1710–1785 MHz) can be provided. A control signal line 54 controls an output selector 50 in order to output a signal of the desired frequency.

The control signal line 54 also adjusts the value of N, according to which output frequency is selected, in order to keep the N/M ratio equal to the multiplier H. It is desirable to keep M constant, in order not to change the loop gain of the circuit. Therefore, it is preferable to adjust only the N value. However, it is not always possible to adjust only the N value and still cover the desired frequency ranges.

Figure 9:
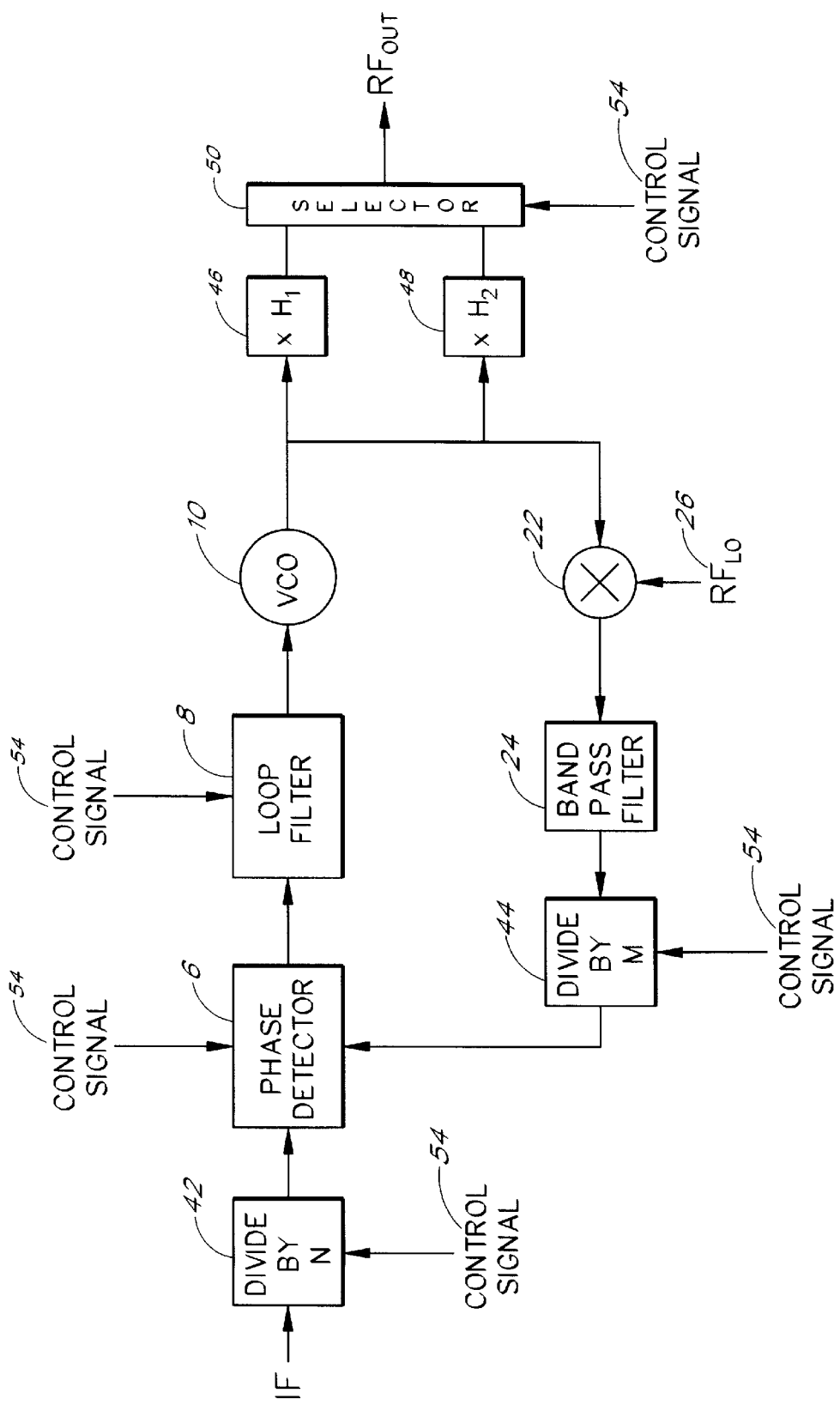
FIG. 9 is a block diagram of a PLL according to a fourth embodiment of the present invention.

FIG. 9 illustrates a fourth embodiment of the present invention. This embodiment is similar to the embodiment of FIG. 8, except that the value of M is adjustable, as well as the value of N. This allows for greater flexibility in designing the circuit to cover desired output frequency ranges. If the value of M is adjusted, however, the loop gain changes. Therefore, in order to compensate for the loop gain, the gain of the phase detector 6 and/or the loop filter 8 are also adjusted.

An advantage of this architecture over the prior art is that only one VCO is required to provide two (or more) frequency bands. Also, the mixer 22 in the loop always has the same input frequency range, allowing the mixer to be optimized for a given application. By controlling the divider ratio N/M so that N/M=H, the modulation of input IF can remain unchanged, when the modulation is identical for the two bands (as it is in the present case for the GSM900/DCS1800 bands). The N and M dividers can be made programmable to allow easy adjustment of the N/M ratio, and to allow multi-band operation.

Figure 10:
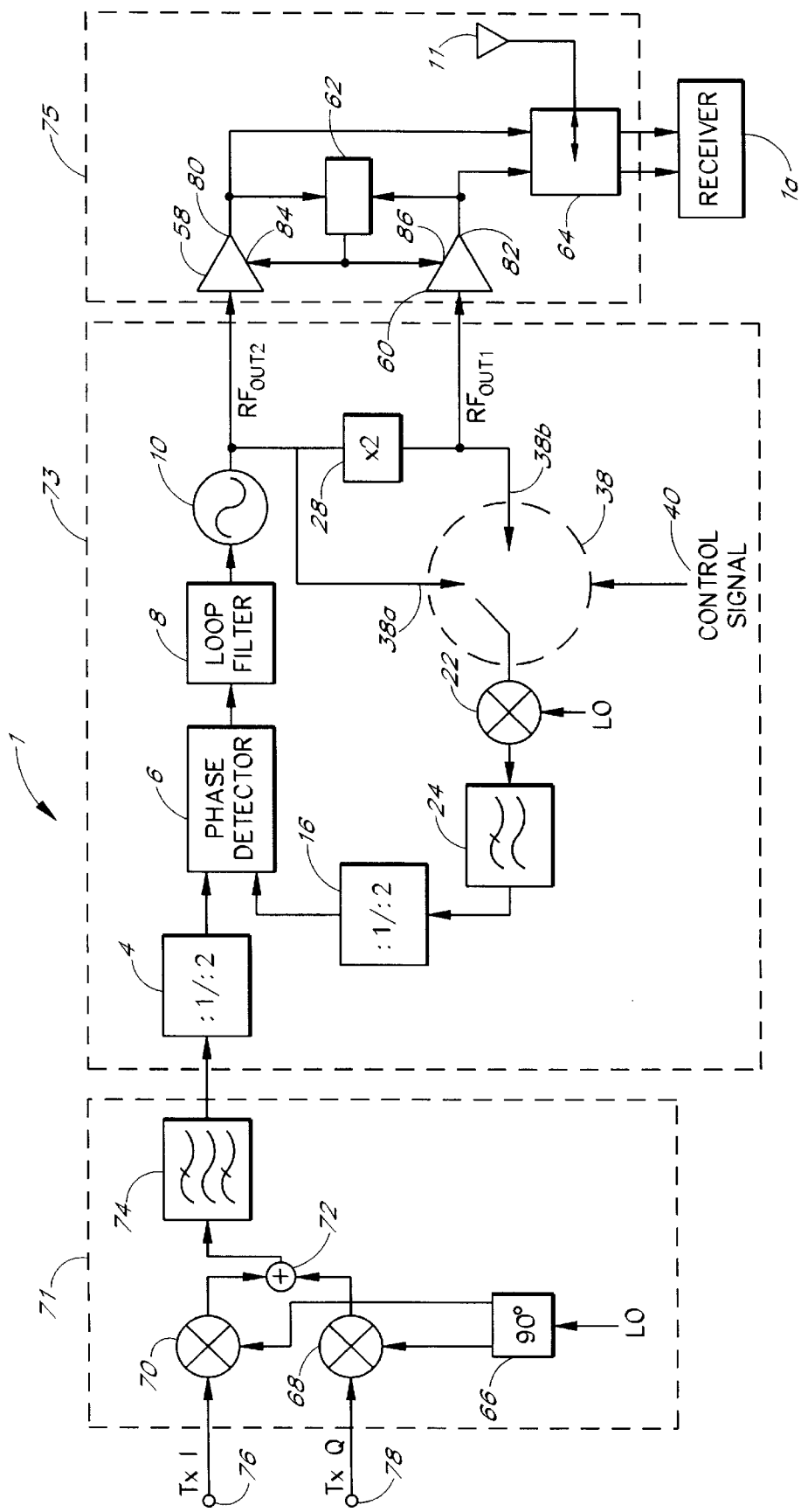
FIG. 10 is a simplified block diagram of a dual band transmitter.

FIG. 10 shows a simplified block diagram of the dual band transmitter 1 shown in FIG. 1. In an embodiment, the dual band transmitter 1 includes the PLL shown in FIG. 6. In FIG. 10, reference numeral 73 refers to the PLL in which the divider 4 divides by 2 (N=2) and the divider 16 divides by 16 (M=2). The dual band transmitter 1 further includes a mixer stage 71 and a power amplifier stage 75. The PLL 73 is interposed between the mixer stage 71 and the power amplifier stage 75, wherein the PLL 73 receives an RF signal having an intermediate frequency (IF) from the mixer stage 71 and feeds an RF signal $RF_{OUT1}$, $RF_{OUT2}$ to the power amplifier stage 75.

The power amplifier stage 75 comprises two power amplifiers 58, 60 connected to the antenna 11 via a band selector 64. The power amplifier 58 is optimized for signals in the 900 MHz range and receives the signal $RF_{OUT2}$, and the power amplifier 60 is optimized for signals in the 1800 MHz range and receives the signal $RF_{OUT1}$. The power amplifier 58 may advantageously be the same as a power amplifier device RF130, and the power amplifier 60 may advantageously be the same as a power amplifier device RF230, both available from Rockwell Semiconductor Systems. Alternatively, the power amplifiers 58, 60 can be implemented in a single power amplifier module.

A controller 62 is connected to outputs 80, 82 and control inputs 84, 86 of the power amplifiers 58, 60. It is contemplated that only one of the power amplifiers 58, 60 is active at a time. The controller 62 monitors the output power level of the active power amplifier 58, 60 and generates a control signal for the active power amplifier 58, 60 so that the RF signal fed to the antenna 11 achieves and maintains, for example, a prescribed power level versus time profile as defined in the GSM standard (GSM 05.05).

The band selector 64 can be configured as a switch or diplexer which connects only one of the power amplifiers 58, 60 at a time to the antenna 11 and prevents that an RF signal from an active power amplifier 58, 60 is fed to the output 80, 82 of the inactive power amplifier 58, 60.

In the illustrated embodiment of the transmitter 1, the power amplifiers 58, 60 are controlled by a single controller 62. Thus, the power amplifiers 58, 60 share one controller 62 so that no duplication of control circuits is necessary resulting in cost savings for dual band cellular phones. By means of control signals (not shown), the controller 62 controls the power amplifiers 58 or 60.

As stated above, the frequency band which the cellular phone uses to communicate with the base transceiver station is determined by external factors. An internal central controller (not shown) of the cellular phone 3 selects the RF carrier and generates a control signal depending on these external factors. The control signal controls a switch (not shown) to connect the controller 62 to the power amplifier 58 or to the power amplifier 60. As soon as the controller 62 is connected to one of the power amplifiers 58, 60, the respective power amplifier 58, 60 is activated while the other power amplifier 58, 60 remains deactive or is deactivated.

In the illustrated embodiment, the mixer stage 71 comprises an I/Q modulator formed by two mixers 68, 70 which receive differential I and Q baseband signals TxI, TxQ. The signals TxI, TxQ are low pass filtered and then applied to the mixers 68, 70 which are, for example, double balanced mixers. A phase shifter 66 shifts a signal (LO signal) from a local oscillator (not shown) by 90 degrees and feeds the local oscillator signal to the mixers 68, 70. The mixer 70 is connected to an input 76 for the I baseband signal, and the mixer 68 is connected to an input 78 for the Q baseband signal. Each mixer 68, 70 generates a modulated signal having the fundamental frequency and harmonic frequencies. An adder 72 combines the modulated signals of the mixers 68, 70 and feeds a sum signal to a band pass filter 74 which is connected to the divider 4 of the PLL. The band pass filter 74 has a pass band of about 400 MHz to block undesired frequency components, particularly the third harmonic of the fundamental frequency.

An I/Q modulator is also referred to, for example, as a quadrature modulator or as a single-side-band (SSB) modulator. For instance, such modulators are described in Simon Haykin, "Communications Systems", 2nd ed., John Wiley & Sons, 1983, pages 80–84.

Figure 11:
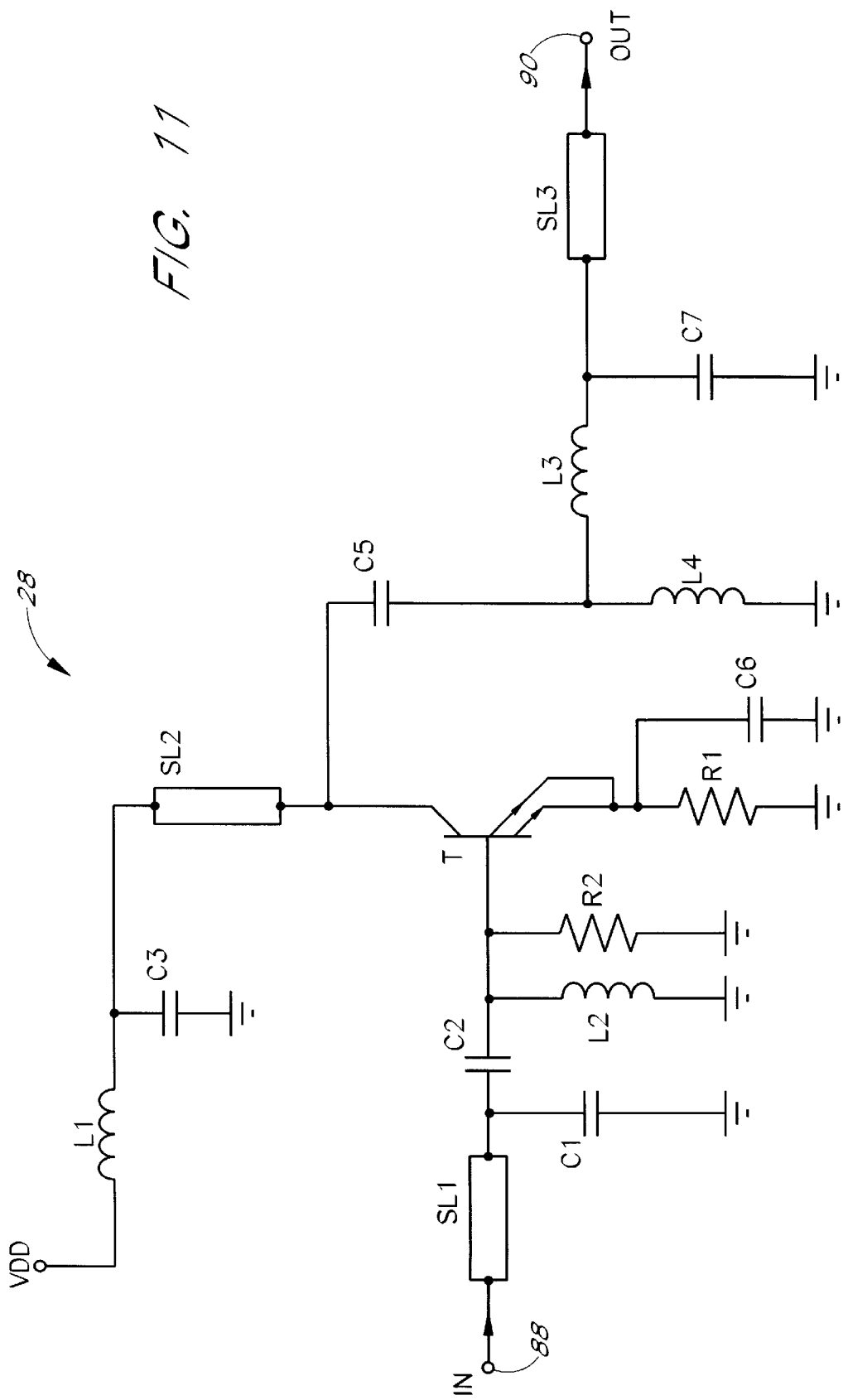
FIG. 11 is a schematic diagram of a frequency doubler circuit.

FIG. 11 shows an embodiment of the frequency doubler 28, for example, shown in FIG. 10. The frequency doubler 28 has an input 88 and an output 90 to connect to the VCO 10 and the mixer 22, respectively. The frequency doubler 28 comprises capacitors C1–C7, inductors L1–L4, resistors R1, R2, SL1–SL3 (striplines) and a transistor T having a base, an emitter and a collector. The transistor T is a bipolar high frequency transistor. In one embodiment, the transistor T is a BFG505 available from Siemens. The stripline SL1 is connected to the input 88, the grounded capacitor C1 and the capacitor C2. The capacitor 2 is connected to the grounded inductor L2, the grounded resistor R2 and the base of the transistor T. In the present embodiment, the capacitors C1 and C2 have capacitances of about 5.6 pF and 4.0 pF, respectively, and the inductor L2 has an inductance of about 12 nH. The resistor R2 has a resistance of about 300 ohms.

The emitter of the transistor T is connected to the grounded resistor R1 and the grounded capacitor C6. The capacitor C6 has a capacitance of about 15 pF and the resistor R1 has a resistance of about 100 ohms in the present embodiment.

The collector of the transistor T is connected to the stripline SL2 and the capacitor C5. The stripline SL2 is further connected to the grounded capacitor C3 and the inductor L1 which is connected to a voltage supply VDD of about 5 volts. The capacitor C5 is further connected to the grounded inductor L4 and the inductor L3. The inductor L3 is connected to the grounded capacitor C7 and the stripline SL3 which is connected to the output 90. The inductors L1, L4 have inductances of about 10 nH each, and the inductor L3 has an inductance of about 2.7 nH. The capacitors C5 and C7 have capacities of about 1.5 pF and 1.8 pF, respectively.

The striplines SL1 and SL3 are 50-ohm lines and assist in matching the input impedance and the output impedance. The stripline SL2 has width of about 10 mils and a length of about 170 mils (1 mil=0.001 inch=0.0254 mm).

The transistor T is a central element of the frequency doubler 28. Because of its nonlinear transfer characteristic, the transistor T generates harmonics. The circuitry connected between the collector and the output 90 is configured to pass only second harmonic and to block all other frequencies.

While the above detailed description has shown, described and identified several novel features of the invention as applied to a preferred embodiment, it will be understood that various omissions, substitutions and changes in the form and details of the described embodiments may be made by those skilled in the art without departing from the spirit of the invention. Accordingly, the scope of the invention should not be limited to the foregoing discussion, but should be defined by the appended claims.

What is claimed is:

1. A cellular phone for a mobile communications system, said phone being operable in a first radio frequency band and a second radio frequency band and comprising a dual band transmitter and an antenna, said dual band transmitter comprising a phase-locked loop (PLL) which can generate two or more output frequency ranges, the PLL comprising:

a first frequency divider configured to divide a frequency signal by a value N;

a phase detector responsive to an output of the first divider;

a loop filter responsive to an output of the phase detector;

a voltage-controlled oscillator (VCO) responsive to an output of the loop filter;

a frequency multiplier responsive to an output of the VCO;

a band-switch having a first input responsive to the output of the VCO, a second input responsive to an output of the frequency multiplier, and a third input responsive to a control signal to select for output from said band-switch one of the first and second inputs;

a mixer having two inputs, one mixer input responsive to the output of the band-switch and a second mixer input responsive to a radio frequency signal;

a second frequency divider configured to divide an input frequency by a value M, the second divider responsive to an output of the mixer, and an output of the second frequency divider providing an input to the phase detector.

2. The phone of claim 1, wherein the phase detector has a selectable gain and the phase detector gain is selectable by the control signal.

3. The phone of claim 2, further comprising a control signal line connected to the band-switch and the phase detector.

4. The phone of claim 3, wherein the loop filter has a selectable gain which is selected by the control signal on the control signal line.

5. The phone of claim 4, wherein the phase detector has a selectable gain, and wherein the loop filter gain and the phase detector gain are selected by the control signal on the control signal line.

6. The phone of claim 5, wherein a bandpass filter is connected between the mixer and the second divider.

7. The phone of claim 6, wherein the frequency multiplier is a frequency doubler and the selectable gain of the loop filter or the phase detector has two settings, one corresponding to the band-switch input responsive to the output of the VCO and a second setting corresponding to the band-switch input responsive to the output of the frequency doubler.

8. The phone of claim 7, wherein the VCO outputs a frequency range of 855–915 MHz.

9. The phone of claim 1, wherein the N and M divider values are adjustable.

10. A cellular phone for a mobile communication system, said phone being operable in a first radio frequency band and a second radio frequency band, comprising a dual band transmitter and an antenna, said dual band transmitter comprising a phase-locked loop (PLL) which can generate two or more output frequency ranges a first power amplifier receiving a first signal and a second power amplifier receiving a second signal, the PLL comprising:

a voltage-controlled oscillator (VCO) having a first output connected to said first power amplifier, said VCO generating said first signal; and a frequency multiplier having an input connected to said first output of the VCO and a second output connected to said second power amplifier, said frequency multiplier receiving said first signal and generating said second signal.

11. The phone of claim 10, further comprising:

a first frequency divider configured to divide a frequency by a value N and having an output connected to a phase detector;

a mixer having two inputs, one mixer input connected to the output of the VCO and a second mixer input connected to local oscillator signal;

a second frequency divider for dividing a frequency by a value M connected to an output of the mixer, an output of the second frequency divider being connected to the phase detector;

a selector coupled to the VCO and the frequency multiplier for selecting an output frequency; and a control signal line connected to the selector and the first divider wherein the control signal line adjusts the value of N such that the ratio N/M equals a multiplier value associated with the selected output frequency.

12. In a cellular phone for a mobile communications system, a method for generating at least two output frequency ranges from a phase locked loop (PLL) having a phase detector, a loop filter, and a single voltage-controlled oscillator (VCO), the method comprising the steps of:

multiplying an output of the VCO by a predetermined value to produce a multiplied output;

selecting a desired output frequency;

selectably feeding back to the phase detector one of the output of the VCO and the multiplied output, based upon the selected desired output frequency, wherein when the output of the VCO is selected, the output of the VCO is fed back, and when the multiplied output is selected, the multiplied output is fed back; and setting a gain of at least one of the phase detector or the loop filter according to the selected output frequency.

13. A dual band transmitter for a wireless phone, comprising:

a first power amplifier, said first power amplifier having a first input for a first signal in a first radio frequency band, and having a first output for an amplified first signal, said first output being connectable to an antenna;

a second power amplifier, said second power amplifier having a second input for a second signal in a second radio frequency band and a second output for an amplified second signal, said second output being connectable to said antenna; and a phase locked loop (PLL) configured to generate two or more output frequency ranges, and connected to the first and second power amplifiers, the PLL comprising:

a first frequency divider configured to divide a frequency signal by a value N;

a phase detector responsive to an output of the first divider;

a loop filter responsive to an output of the phase detector;

a voltage-controlled oscillator (VCO) responsive to an output of the loop filter and providing said first signal;

a frequency multiplier responsive to an output to the VCO and providing said second signal;

a band-switch having a first input responsive to the output of the VCO, a second input responsive to an output of the frequency multiplier, and a third input responsive to a control signal to select for output from said band-switch one of the first and second inputs;

a mixer having two inputs, one mixer input responsive to the output of the band-switch and a second mixer input responsive to a radio frequency signal;

a second frequency divider configured to divide an input frequency by a value M, the second divider responsive to an output of the mixer, and an output of the second frequency divider providing an input to the phase detector.

14. The dual band transmitter of claim 13, wherein the phase detector has a selectable gain and the phase detector gain is selectable by the control signal.

15. The dual band transmitter of claim 13, wherein further comprising a control signal line connected to the band-switch and the phase detector.

16. The dual band transmitter of claim 15, wherein the loop filter has a selectable gain which is selected by the control signal on the control signal line.

17. The dual band transmitter of claim 16, wherein the phase detector has a selectable gain, and wherein the loop filter gain and the phase detector gain are selected by the control signal on the control signal line.

18. The dual band transmitter of claim 17, wherein a bandpass filter is connected between the mixer and the second divider.

19. The dual band transmitter of claim 17, wherein the frequency multiplier is a frequency doubler and the selectable gain of the loop filter or the phase detector has two settings, one corresponding to the band-switch input responsive to the output of the VCO and a second setting corresponding to the band-switch input responsive to the output of the frequency doubler.

20. The dual band transmitter of claim 19, wherein the VCO outputs a frequency range of 855–915 MHz.

21. The dual band transmitter of claim 13, wherein the N and M divider values are adjustable.

22. The dual band transmitter of claim 15, wherein the frequency doubler comprises a combination of a mixing element and a filter, said mixing element receiving the output of the VCO and generating a signal which comprises a doubler frequency which is twice the frequency of the output of the VCO, and said filter having a characteristic to pass said doubler frequency and to block undesired frequencies.

23. A dual band transmitter for a wireless phone, comprising:

a first power amplifier, said first power amplifier having a first input for a first signal in a first radio frequency band, and a first output for an amplified first signal, said first output being connectable to an antenna;

a second power amplifier, said second power amplifier having a second input for a second signal in a second radio frequency band and a second output for an amplified second signal, said second output being connectable to said antenna; and a phase locked loop (PLL) configured to generate two or more output frequency ranges, and connected to the first and second power amplifiers, the PLL comprising:

a first frequency divider configured to divide a frequency signal by a value N;

a phase detector responsive to an output of the first divider;

a loop filter responsive to an output of the phase detector;

a voltage-controlled oscillator (VCO) responsive to an output of the loop filter and providing said first signal;

at least one frequency multiplier responsive to an output to the VCO and providing said second signal;

a mixer having two inputs, one mixer input responsive to the output of the VCO and a second mixer input responsive to a local oscillator signal;

a second frequency divider configured to divide an input frequency by a value M and connected to an output of the mixer, and an output of the second frequency divider providing an input to the phase detector; and a selector connected to the output of the at least one frequency multiplier, the selector configured to select an output frequency.

24. The dual band transmitter of claim 23, further comprising a control signal line connected to the selector and the first frequency divider.

25. The dual band transmitter of claim 24, wherein the control signal line is configured to adjust the value of N such that the ratio N/M equals a multiplier value associated with the selected output frequency.

26. The dual band transmitter of claim 25, wherein the control signal line is connected to the second frequency divider, the phase detector and the loop filter; and wherein at least one of the value of M, the gain of the phase detector and the gain of the loop filter are adjustable.

27. The dual band transmitter of claim 23, wherein a bandpass filter is connected between the mixer and the second frequency divider.

28. The dual band transmitter of claim 24, wherein one frequency multiplier is connected to the output of the VCO, and the selector selects between the output of the VCO and the output of the frequency multiplier.

29. The dual band transmitter of claim 28, wherein the frequency multiplier is a frequency doubler, and the VCO outputs a frequency range of 855–915 MHz.

30. A cellular phone for a mobile communications system, said phone being operable in a first radio frequency band and a second radio frequency band, comprising a dual band transmitter and an antenna, said dual band transmitter comprising a phase-locked loop (PLL) which can generate two or more output frequency ranges, the PLL comprising:
 a first frequency divider configured to divide a frequency signal by a value N;
 a phase detector responsive to an output of the first frequency divider;
 a loop filter responsive to an output of the phase detector;
 a voltage-controlled oscillator (VCO) responsive to an output of the loop filter;
 at least one frequency multiplier responsive to an output of the VCO;
 a mixer having two inputs, one mixer input responsive to the output of the VCO and a second mixer input responsive to a local oscillator signal;
 a second frequency divider configured to divide an input frequency by a value M and connected to an output of the mixer, an output of the second divider providing an input to the phase detector; and
 a selector connected to the output of the at least one frequency multiplier, the selector configured to select an output frequency.

31. The phone of claim 30, further comprising a control signal line connected to the selector and the first frequency divider.

32. The phone of claim 31, wherein the control signal line is configured to adjust the value of N such that the ratio N/M equals a multiplier value associated with the selected output frequency.

33. The phone of claim 32, wherein the control signal line is connected to the second frequency divider, the phase detector and the loop filter; and wherein at least one of the value of M, the gain of the phase detector and the gain of the loop filter is adjustable.

34. The phone of claim 31, wherein a bandpass filter is connected between the mixer and the second frequency divider.

35. The phone of claim 34, wherein one frequency multiplier is connected to the output of the VCO, and the selector selects between the output of the VCO and the output of the frequency multiplier.

36. The phone of claim 35, wherein the frequency multiplier is a frequency doubler, and the VCO outputs a frequency range of 855–915 MHz.

37. In a cellular phone for a mobile communications system, a method for generating at least two output frequency ranges from a phase locked loop (PLL) having a single voltage controlled oscillator (VCO), an adjustable first frequency divider which divides by a value N, a second frequency divider which divides by a value M, a phase detector, and a loop filter, the method comprises the steps of:
 multiplying an output of the VCO by a predetermined value to produce a multiplied output frequency;
 selecting a desired output frequency of one of the VCO output and the multiplied output frequency; and
 adjusting the values of the first frequency divider such that a ratio N/M equals the value of the predetermined value when the multiplied output is selected, and adjusting the ratio N/M equal to the value "1" when the VCO output is selected.

38. The method of claim 37, wherein the step of adjusting further comprises adjusting one of the value of M, a gain of the phase detector and a gain of the loop filter.

39. The method of claim 38, wherein the step of multiplying further comprises multiplying the output of the VCO by a plurality of predetermined values, the step of selecting further comprises selecting one of the VCO output and the plurality of multiplied output frequencies, and the step of adjusting further comprises adjusting the ratio N/M equal the predetermined value corresponding to the selected output frequency.

40. A dual band transmitter for a wireless phone, comprising:
 a first power amplifier, said first power amplifier having a first input for a first signal in a first radio frequency band, and a first output for an amplified first signal, said first output being connectable to an antenna;
 a second power amplifier, said second power amplifier having a second input for a second signal in a second radio frequency band and a second output for an amplified second signal, said second output being connectable to said antenna; and
 a phase locked loop (PLL) which can generate two or more output frequency ranges, the PLL comprising:
  a voltage-controlled oscillator (VCO) having a first output connected to said first power amplifier, said VCO generating said first signal;
  a frequency multiplier having an input connected to said first output of the VCO and a second output connected to said second power amplifier, said frequency multiplier receiving said first signal and generating said second signal.

41. The dual band transmitter of claim 40, further comprising:
 a first frequency divider configured to divide a frequency signal by a value N;
 a mixer having two inputs, one mixer input responsive to the output of the VCO and a second mixer input responsive to a local oscillator signal;
 a second frequency divider configured to divide a frequency by a value M and connected to an output of the mixer, an output of the second frequency divider being connected to an input of a phase detector;
 a selector coupled to the VCO and the frequency multiplier for selecting an output frequency and input it to the mixer; and a control signal line connected to the selector and the first frequency divider, wherein the control signal line adjusts the value of N such that the ratio N/M equals a multiplier value associated with the selected output frequency.

42. The dual band transmitter of claim 41, wherein the control signal line is connected to the second frequency divider, the phase detector and the loop filter; and one of the value of M, the gain of the phase detector and the gain of the loop filter are adjustable.

43. The dual band transmitter of claim 42, further comprising a bandpass filter connected between the mixer and the second divider.

44. The dual band transmitter of claim 42, wherein only one frequency multiplier is connected to the output of the VCO, and the selector selects between the output of the VCO and the output of the frequency multiplier.

45. The dual band transmitter of claim 44, wherein the frequency multiplier is a frequency doubler, and the VCO outputs a frequency range of 855–915 MHz.

46. The dual band transmitter of claim 45, wherein the frequency doubler comprises a combination of a mixing element and a filter, said mixing element receiving the output of the VCO and generating a signal which comprises a doubler frequency which is twice the frequency of the output of the VCO, and said filter having a characteristic to pass said doubler frequency and to block undesired frequencies.

47. In a cellular phone for a mobile communications system, a method for generating at least two output frequency ranges from a phase locked loop (PLL) having a phase detector, a loop filter, and a single voltage-controlled oscillator (VCO), the method comprising the steps of:

multiplying an output of the VCO by a plurality of predetermined values to produce a plurality of multiplied outputs;

selecting a desired output frequency;

selectably feeding back to the phase detector one of the outputs of the VCO and one of the plurality of multiplied outputs, based upon the selected desired output frequency, wherein when the output of the VCO is selected, the output of the VCO is fed back, and when the multiplied output is selected, the multiplied output is fed back; and setting a gain of at least one of the phase detector or the loop filter according to the selected output frequency.

48. In a dual band transmitter for a wireless phone, a method for generating two output frequency ranges from a phase locked loop (PLL) having a single voltage controlled oscillator (VCO), the method comprising the steps of:

multiplying an output of the VCO by a predetermined value to produce a multiplied output frequency;

selecting a desired output frequency of one of the VCO output and the multiplied output frequency; and adjusting a value of a first divider that divides a frequency signal by the value N and inputs it to a phase detector and a value M of a second divider that divides a signal responsive to the multiplied output by the value M and inputs it to the phase detector such that a ratio N/M equals a predetermined value when the multiplied output is selected, and adjusting the ratio N/M equal to the value "1" when the VCO output is selected.

49. In a dual band transmitter for a wireless phone, a method for generating two output frequency ranges from a phase locked loop (PLL) having a single voltage controlled oscillator (VCO), the method comprising the steps of:

multiplying an output of the VCO by a predetermined value to produce a multiplied output frequency;

selecting a desired output frequency of one of the VCO output and the multiplied output frequency; and adjusting a value of a first divider that divides a frequency signal by the value N and inputs it to a phase detector and a value M of a second divider that divides a signal responsive to the multiplied output by the value M and inputs it to the phase detector such that a ratio N/M equals a predetermined value when the multiplied output is selected, adjusting the ratio N/M equal to the value "1" when the VCO output is selected, and adjusting the value of M, a gain of the phase detector and/or a gain of a loop filter receiving a signal from the phase detector.

50. In a dual band transmitter for a wireless phone, a method for generating two output frequency ranges from a phase locked loop (PLL) having a single voltage controlled oscillator (VCO), the method comprising the steps of:

multiplying an output of the VCO by a plurality of predetermined values to produce a plurality of multiplied output frequencies;

selecting a desired output frequency of one of the VCO output and one of the plurality of multiplied output frequencies; and adjusting a value of a first divider that divides a frequency signal by the value N and inputs it to a phase detector and a value M of a second divider that divides a signal responsive to the multiplied output by the value M and inputs it to the phase detector such that a ratio N/M equals a predetermined value corresponding to the selected output frequency when the multiplied output is selected, and adjusting the ratio N/M equal to the value "1" when the VCO output is selected.

* * * * *